United States Patent [19]

Blaum et al.

[11] Patent Number: 5,351,246
[45] Date of Patent: Sep. 27, 1994

[54] METHOD AND MEANS FOR CODING AND REBUILDING THAT DATA CONTENTS OF UNAVAILABLE DASDS OR REBUILDING THE CONTENTS OF DASDS IN ERROR IN THE PRESENCE OF REDUCED NUMBER OF UNAVAILABLE DASDS IN A DASD ARRAY

[75] Inventors: Miguel M. Blaum; Ron M. Roth, both of San Jose, Calif.

[73] Assignee: International Business Machines Corporation, Armonk, N.Y.

[21] Appl. No.: 177,633

[22] Filed: Jan. 3, 1994

Related U.S. Application Data

[63] Continuation of Ser. No. 718,724, Jun. 21, 1991, abandoned.

[51] Int. Cl.$^5$ ............................................. G06F 11/00
[52] U.S. Cl. .................................................... 371/10.1
[58] Field of Search .................. 371/10.1, 10.2, 8.1, 371/40.1, 37.1, 37.4, 37.7, 40.4; 395/575; 365/201

[56] References Cited

U.S. PATENT DOCUMENTS

| | | | |
|---|---|---|---|
| 3,685,016 | 8/1972 | Eachus | 340/146.1 |
| 3,988,580 | 10/1976 | Warman et al. | 371/40.4 |
| 4,092,732 | 5/1978 | Ouchi et al. | 364/900 |
| 4,201,976 | 5/1980 | Patel | 371/50 |
| 4,205,324 | 5/1980 | Patel | 371/50 |
| 4,752,914 | 6/1988 | Nakano et al. | 371/10.2 |
| 4,757,442 | 7/1988 | Sakata | 371/12 |
| 4,796,260 | 1/1989 | Schilling et al. | 371/39 |
| 4,914,656 | 4/1990 | Dunphy, Jr. et al. | 371/40.4 |
| 4,989,205 | 1/1991 | Dunphy, Jr. et al. | 371/10.1 |
| 4,989,206 | 1/1991 | Dunphy, Jr. et al. | 371/40.4 |
| 5,072,378 | 12/1991 | Manka | 371/40.1 |

OTHER PUBLICATIONS

"A Case for Redundant Arrays of Inexpensive Disks (RAID)", Rept. #UCB/CSD 87/391, Dec., 1987, Computer Science Division, U. of Calif., Berkeley.

Co-Pending App. Blaum et al., U.S. Ser. No. 07/653,596, "Method and Means for Encoding and Rebuilding Data Contents of up to Two Unavailable DASDs in an Array of DASDs", filed Feb. 11, 1991 (IMB Ref. #SA9-90-055).

"Providing Fault Tolerance in Parallel Secondary Storage Systems" Computer Science, Princeton Univ., Report CA-TR-057-86, Nov. 7, 1986.

Prusinkiewicz, et al., "A Double Track Error Correction Code for Magnetic Tape, IEEE Trans. on Computers", pp. 642–645, Jun. 1976.

*Primary Examiner*—Robert W. Beausoliel, Jr.
*Assistant Examiner*—Thung My Chung
*Attorney, Agent, or Firm*—R. Bruce Brodie

[57] ABSTRACT

A method and means for coding an $(M-1)\times M$ data array written onto an array of M synchronous recording paths and for rebuilding and writing onto spare recording path capacity when up to a preselected number R of array DASDs fail, or one DASD becomes erroneous and up to $R-2$ fail. Data is mapped into the parallel paths using an $(M-1)\times M$ data and parity block array as the storage model where M is a prime number and each block extent is uniform and at least one bit in length. The $(M-1)\times M$ data and parity block array is encoded to include zero XOR sums along a traverses of slopes $0, 1, 2, \ldots, P-1$, extended cyclically over said data array. Rebuilding data and parity blocks is occasioned upon unavailability of no more than R less than or equal to P recording path failures, or one recording path in error and up to $R-2$ recording path failures. This includes calculating XOR-sums along the traversed paths of $P-1$ slopes, cyclic and linear shifts and XOR operations, recovering the unavailable DASDs by means of iterative solution of a set of recursions, and finally writing the rebuilt array back to onto M recording paths inclusive of any spare paths.

9 Claims, 5 Drawing Sheets

FLOW OF CONTROL FOR ENCODING AND REBUILDING DATA

ELEMENTS OF A DASD ARRAY

FIG. 2: Lines of slope 0 (rooks).

FIG. 3: Lines of slope 1 (bishops).

FIG. 4: Lines of slope 2 (knights).

FIG. 5: An element of the array code.

FLOW OF CONTROL FOR ENCODING AND REBUILDING DATA

METHOD AND MEANS FOR CODING AND REBUILDING THAT DATA CONTENTS OF UNAVAILABLE DASDS OR REBUILDING THE CONTENTS OF DASDS IN ERROR IN THE PRESENCE OF REDUCED NUMBER OF UNAVAILABLE DASDS IN A DASD ARRAY

This application is a continuation of application Ser. No. 07/718,724, filed Jun. 21, 1991, abandoned.

FIELD OF THE INVENTION

This invention relates to a method and means for block coding an $(M-1) \times M$ bit or byte data array on an array of M DASDs or other system of parallel failure independent recording paths, and rebuilding the data array contents of either R unavailable DASDs (failures/erasures) from the remaining M-R DASDs or a single DASDS in error in the presence of a reduced number of unavailable DASDs.

DESCRIPTION OF RELATED ART

The DASD Array and Data Striping, Parity, and Sparing

One incarnation of a DASD array (RAID 3) designates synchronous access to multiple DASDs for storing data+parity with/without sparing. The data are segmented and written (striped) across the array in column major order. This accords with the typology provided by Patterson et al, "A Case For Redundant Arrays Of Inexpensive Disks (RAID)", Report No. UCB/CSD 87/391, December 1987, Computer Science Division, U. of California, Berkeley.

The parity coding and striping of data across multiple DASDs and the rebuilding of data after a single DASD failure by logically combining (XORing) remaining available blocks was introduced by Ouchi et al U.S. Pat. No. 4,092,732, "System for Recovering Data Stored in a Failed Memory Unit", issued May 30, 1978. Also, the dynamic substitution of a formatted DASD for a failed unit ("hot sparing" was described for a single parity domain by Arvin Park et al, "Providing Fault Tolerance In Parallel Secondary Storage Systems", Dept. Computer Science, Princeton University, Report CS-TR-057-86, Nov. 7, 1986. Likewise, dynamically configuring multiple parity domains and sharing of formatted spares by the domains was taught by Dunphy et al, U.S. Pat. No. 4,914,656, "Disk Drive Memory", issued Apr. 3, 1990.

Because RAID 3 arrays read and write parity coded segmented data to N+P synchronous DASDs (N data and P parity DASDs), the data rate increases by N*single DASD rate. Also, the logical track size increases by N*single DASD track length. The P parity DASDs permits the array to continue operation even where one or more DASDs have failed (degraded mode). The failure limit is based on the properties of the parity coding, the amount of spare storage capacity, the time available to reconstitute missing data, the likelihood of multiple/concurrent failures etc.

Degraded Mode and Data Rebuild for a Single DASD Failure

In degraded mode where P=1, if the parity DASD is the one that is unavailable, the data is nonetheless accessible, N blocks at a time, from the N data DASDs. If one of the data DASD is the one that has failed, then it is necessary to rebuild the missing block from each referenced stripe or ordered segment set by logically combining the remaining blocks from the same stripe or set. Since this operation must be performed for each access, it substantially lowers throughput.

Where a formatted spare DASD is substituted for a failed DASD and data rebuilt and rewritten on said spare (rebuild mode), throughput returns to its normal rate. The array is said to change from a degraded to a normal (fault tolerant) mode. It should be noted that the rebuild and rewriting of the missing data onto a spare DASD may be done on a scheduled or opportunistic basis. Relatedly, the array becomes prone to total disablement should another failure occur while in degraded or rebuild modes.

Array Data Rebuild for Up to Two DASD Failures

Blaum et al, U.S. Ser. No. 07/653,596, "Method and Means for Encoding and Rebuilding Data Contents of Up to Two Unavailable DASDS in an Array of DASDS", filed Feb. 11, 1991 (IBM Ref. No. SA9-90-055) teaches a method for coding and rebuilding an $(M-1) \times M$ bit data array onto an M synchronous DASD array when up to two DASDs fail, M being a prime number. Pairs of simple parities are recursively coded in respective diagonal major and intersecting row major order data array directions. This covers the array as if it were a topological torus. Rebuilding data upon unavailability of no more than two DASDs requires repeating the coding step where the diagonals are oppositely sloped and writing the rebuilt array back.

Data Error and Erasure

"Data error" means any change in stored value as a consequence of a random noise or burst process. In systems storing binary values such as 1 1 1 0 0 1 0 0, remanent magnetization states change such that some 1's become 0's and some 0's become 1's. This might appear as 1 1 0 0 0 1 0 1. Here, the values in the 3rd and 8th positions from the left are random errors. A run of errors due to a burst source might appear as 1 1 1 1 1 1 1 0. Note, while the first seven consecutive positions were overwritten, only positions 3 through 7 are actually in error.

"Erasure" is the removal of any data value in a storage location. For example, the data string 1 x x x x 1 0 0 omits any binary values in positions 2 through 5.

Simple Parity Codes

Parity codes detect and correct errors in different data contexts. These include communication over noisy channels and recording of interleaved bits, bytes, or blocks on DASD arrays. Simple parity codes are favored because of processing simplicity (XORing to recover lost block) and the parity domain can be made very large (redundancy/data storage is very small).

It is known that detection and correction of errors of data stored in finite and semi-infinite arrays such as DASDs or on magnetic tape using simple parity codes could be enhanced by taking parity diagonally and transversely across a data array as well as longitudinally. These parity codes are of the block type meaning that the actions taken with respect to one finite array are independent of the actions taken in its neighbors. This avoids the propagation of error or mistake from block to block as may be possible in codes of the cyclic type.

Eachus, Patel, and Schilling References

Eachus, U.S. Pat. No. 3,685,016, "Array Method And Apparatus For Encoding Detecting And/Or Correcting Data", issued Aug. 15, 1972, discloses a majority logic error detection method as applied ever near infinite strings of convolutional coded data. In Eachus, an N*K data array uses a decode of a first check segment over N bits as a series of XOR additions along each column of the array, N being a prime number. Eachus also discloses the decoding of second and third check segments over N bits as a series of XOR additions along a series of respective left and right diagonals taken across the array.

Patel, U.S. Pat. No. 4,201,976, issued May 5, 1980 and Patel., U.S. Pat. No. 4,205,324, issued May 27, 1980 extended Eachus through the use of spare rows and columns. The rows supported diagonal and transverse parity to enhance error correction in a multiple track magnetic tape stored data system.

Patel's methods were based upon Prusinkiewicz and Budkowski, "A Double Track Error Correction Code for Magnetic Tape", IEEE Trans. on Computers", pp 642-645, June 1976. It constitutes a cyclic code defined over a near infinite field i.e. a convolution code over an infinite tape. Patel added a second diagonal. Disadvantageously, an error in the convolutional code propagates throughout the encoded sequence, however long. Block codes limit error propagation to the individual length.

Schilling et al, U.S. Pat. No. 4,796,260, "Schilling-Manela Forward Error Correction and Detection Code Method and Apparatus", issued Jan. 3, 1989 discloses the use of two sets of differently sloped diagonal parity determinations over an arbitrarily sized G*H data array.

SUMMARY OF THE INVENTION

It is an object of this invention to devise a method and means for enhancing the availability of a DASD array in the presence of data errors, erasures, and DASD failures.

It is a related object to devise a method and means for encoding and rebuilding of the data contents including erasures of up to a predetermined number R of unavailable DASDs in an array of M DASDs.

It is still another object to devise a method and means (1) to permit degraded mode operation even in the presence of more than one DASD failure and (2) devise a method of simple parity group coding and data rebuilding on a spare DASD that returns the DASD array to fault tolerance.

It is yet another object to devise a method and means to (3) use simple parity coding and XOR operations thereby avoiding multiplications over finite fields as found in standard Reed-Solomon codes, (4) execute only XOR parity coding over the block rather than convolutional type coding as described in Patel, and (5) reduce the number of operations associated with executing a write update and simple parity encoding.

The foregoing objects are satisfied by a method and means comprising the steps of (a) simple parity coding over a data array of critical dimension; (b) striping and writing the parity coded data array to a DASD array; and (c) responsive to up to a predetermined number R of DASD failures, rebuilding the data on a patterned or random basis by accessing the data array and repeating steps (a) and (b) where the recursion is but slightly modified to take the unavailable DASDs into account.

In a DASD array of $M=N$ data$+P$ parity$+S$ spare DASDs, the R unavailable DASDs can be rebuilt according to the invention where $R \leq P$. Alternatively, up to one DASD in error can be corrected in the presence of up to $R-2$ unavailable DASDs for $R \leq P$.

In processing, an $(M-1) \times M$ bit or byte data array is emulationally extended cyclically in the sense that a dummy "phantom" of 0's is added to obtain an M*M bit or byte data array. Then, the last row is followed by the first column and the last column is followed by the first column. In other words, both rows and columns are considered following a cyclic order.

More particularly, the coding steps (a) or (c) include a recursion to generate a preselected number R of simple parity encodings over bits within an $(M-1) \times M$ data bit array. The generation takes place using parity along lines of different slopes. The array size M must be a prime number.

Next, at completion of coding the data array or portions thereof, $(M-1)$ bits or bytes at a time in vertical order are striped and written to counterpart ones of M failure independent DASDs. Lastly, responsive to the unavailability of up to a preselected number R of DASDs, unavailable data is rebuilt from no less than $(M-R)$ available DASDs by accessing the data array inclusive of erasures and repeating steps (a) and (b) on a scheduled or opportunistic basis in the same manner as the parity coding was originally processed.

The method and means of this invention also can rebuild and rewrite one DASD in error and up to $R-2$ unavailable DASDs where $R \leq P$. The DASD in error requires the redundancy equivalent of two parity DASDs to identify and correct the errant unit.

It should be appreciated that the $(M-1) \times M$ array is one in which lines of different slopes exhibit even parity. Bits forming a referenced byte for instance are read vertically. Arbitrarily, a traverse would start in the upper left hand corner defining thereby M lines of a given slope. With such multiple coded traversal parity, it follows that such an $(M-1) \times M$ array code can recover a preselected number R of erased bytes if and only if M is a prime number.

If the array reserves sevral DASDs as spares or otherwise reserves space on the DASDs within the array, then spares may be substituted for failed DASDs and rebuilt data written to the M DASD array inclusive of the spares.

In the case of DASD arrays where no more than three DASD may fail, the method includes (a) parity coding and writing an $(M-1) \times M$ data bit or byte array onto the M DASDs by following a traverse emulating the positively sloped motions of a chess rook, bishop, and knight extended cylically over the data array such that the logically combined (XORed) values over the traverses sum to zero, M being a prime number; and (b) responsive to the unavailability of up to three DASDs, rebuilding the data by repeating the coding step using data from the $M-1$ to $M-3$ available DASD's on a scheduled or opportunistic basis and rewriting the rebuild data onto spare DASD array capacity.

BRIEF DESCRIPTION OF THE DRAWINGS

FIGS. 2–4 relate to the coding step for rebuilding up to three unavailable DASDs in which an (M−1)×M data array is traversed in patterns emulating the chessboard moves of a rook, bishop, and knight exhibiting respective slope traversals of 0, 1, and 2.

FIG. 5 exemplifies of a 4×5 data array with zero parity along all possible traverses of slopes 0, 1, and 2.

BRIEF DESCRIPTION OF THE DRAWINGS

Overview of DASD Array Read and Write Operations

Figure 1:
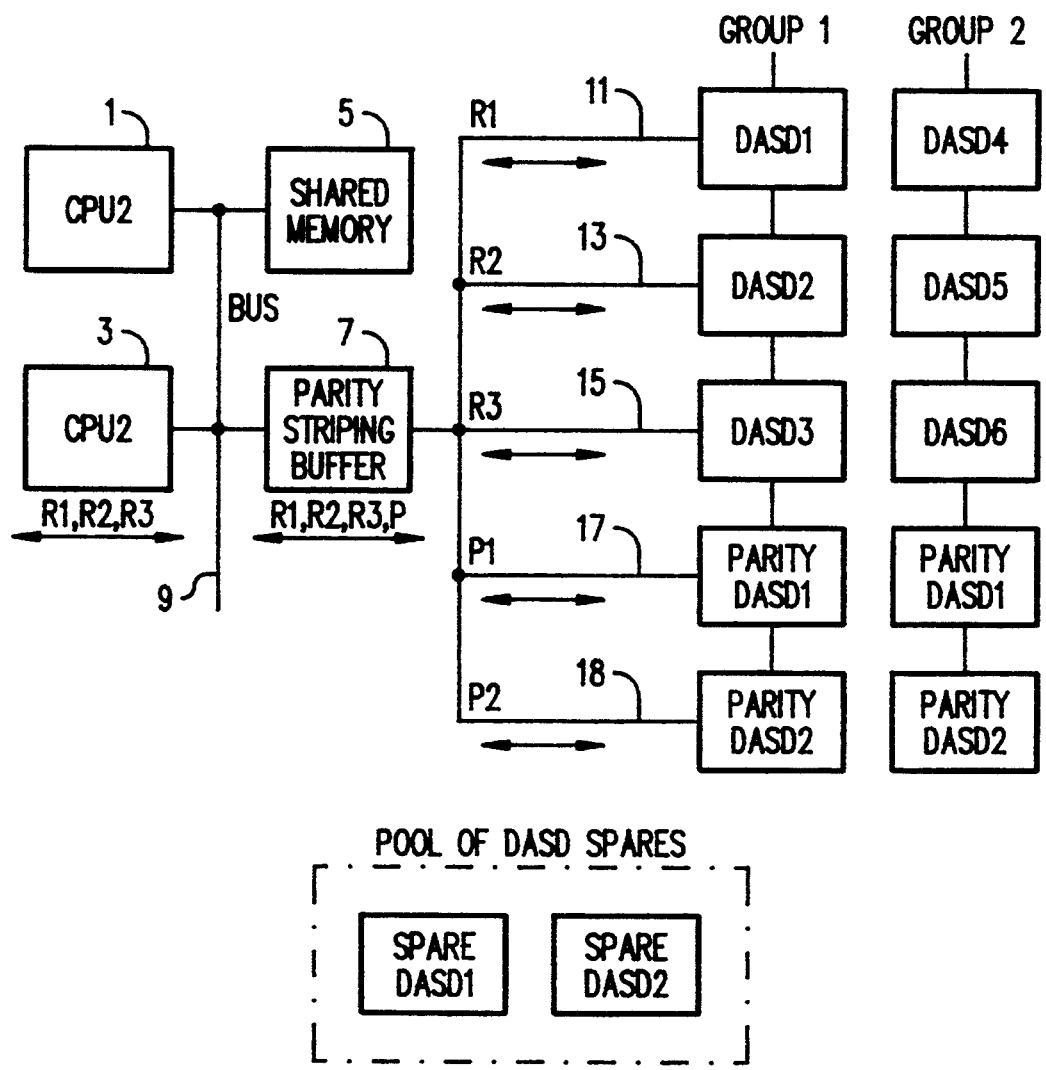
FIG. 1 shows a synchronous DASD array illustrating striping, parity encoding, sparing, and data redo on spares.

Referring now to FIG. 1, there is shown an array comprising a first and second DASD parity group coupling an intelligent parity generating and striping buffer (PSB) 7 over parallel paths 11, 13, 15, and 17. A processor array formed from CPU1 and CPU2 is coupled to data and control bus 9.

Processor 1 or 3 originated read and write commands establish a table directed access path to a parity group of DASDs by way of a standard accessing protocol and data movement over bus 9 shared memory 5 to PSB 7. The logical processing of a logical files is executed at PSB 7 In this regard, logical processing includes both striping (serial/parallel conversion of data) and parity generation and checking. The paths to and from the DASDs are table directed. In principle, an address specified in a read or write argument is translated by the PSB 7 via an array storage address table into the actual physical path between PSB 7 and the location on the DASDs of the requisite parity group.

To execute a write command, PSB 7 must first buffer the new data from the processor, read and buffer the (M−1)×M data array from the DASD parity group within which the striped or interleaved elements of the block are to be written, recursively recompute the array including new designated diagonal and row parities taking the old data, old parity, and new data into account, and then rewrite the modified data array back onto the DASD parity group. For a read operation, PSB 7 responsive to a read command from a processor performs inverse operation sequence to that of writing. That is, the data array within which the data to be read must be extracted is buffered in PSB 7, appropriate row and diagonal parities tested, and the addressed data transferred across bus 9 to shared memory 5.

DASD Failure and Hot Sparing

In the event that a DASD failure occurs while read accessing data, PSB 7 can select one from a number of alternatives. These include regenerating corrupted data on-the-fly by either (1) retry of the read command or (2) reconstruction of the data from remaining DASDs and replacement according to the method of the invention.

With respect to the processor 1 or 3 originating the read command, one strategy is to notify it of the failure occurrence only AFTER completion of the read data movement. This would permit the processor to control substitution of a spare DASD from a pool or from a DASD reserved exclusively to each parity group in the manner of Park et al. Responsive to processor commands such as DISABLE and RECONSTRUCT, PSB 7 can cause the failed DASD to be replaced with a designated spare DASD by table substituting the directory path to the spare for the table directory path of the failed DASD. Next, the data on the failed DASD can be rebuilt on the designated spare DASD.

In one embodiment, PSB 7 stores a bit map of DASD availability and address map of the DASDs. In turn, the availability and address maps are referenced during the processing of each access command. Alterations to the maps may be originated by the processor using the DISABLE and RECONSTRUCT commands. In such an implementation, a permanent address is assigned to the e SPARE DASD. Significantly, after failure notification, the processor 1 or 3 can address map of the DASDs. In turn, the availability and address maps are referenced during the processing of each access command. Alterations to the maps are originated by the processor using the DISABLE and RECONSTRUCT commands. The present implementation assigns a permanent address to the SPARE DASD.

Significantly, after failure notification, the processor can (1) elect to do nothing; OR
(2) generate commands causing the addresses of the spare DASDs to be substituted for the addresses for up to two of the failed DASDs; AND
(3) reconstruct the contents of up to two failed DASD on the assigned spares by modulo 2 addition of parities plus remaining data DASDs according to the reconstruction method set out below.

Note, the dynamic substitution of a spare formatted DASDs for other DASDs online is termed "hot sparing".

Rebuilding R≦P DASDs According to the Invention

It should be appreciated that where an M DASD array has M=N data+P parity+S spare DASDs, that any (M−1)×M data array including up to R unavailable DASDs, where R≦P can be rebuilt and rewritten on R≦S available spares. Also, where one DASD is in error it can be corrected even if it is in the presence of up to R−2 unavailable DASDs.

Illustratively, the invention is first described with reference to coding and rebuilding a data bit or byte array stored on an M DASD array for up to three unavailable DASDs. Referring now to FIGS. 2–4, there is shown an encoded (M−1)×M data bit or byte array. The coding step according to this invention assumes an M-th dummy row, referred to as a "phantom" row, which is all-zero. This row is not part of the coded data and, as such, need not be physically present. For the sake of clarity, however, it is drawn in the FIGS. 2 to 5 where the coding features are described for the case of M=5 DASDs.

Referring now to FIG. 2, there is illustrated the M slope-0 parity lines, which can be thought of as the traverse of a rook moving on a chesssboard. Namely, once coded, the parity along each horizontal line, that is each row in the array, must be even. Each parity line is marked by a different symbol (diamond for the first row, triangle for the second, etc.).

Referring now to FIG. 3, there is exhibited the M slope-1 parity lines, resembling the bishop moves on a chessboard. The first square (=array entry) in each such parity line can be arbitrarily chosen, and consecutive squares are traversed by one-square-right and onesquare-up moves, until the first square is revisited. All M slope lines are pairwise disjoint. Once coded, the array has even parity along these traverses.

Referring now to FIG. 4, there is depicted the M slope-2 parity lines, resembling the knight moves on a chessboard. Again, the first square is arbitrary, and subsequent squares are defined by consecutive one-square-right and two-squares-up moves, until the first square is reached. As in the slope-0 and slope-1 case, all M slope-2 lines are pairwise disjoint, and any coded array has even parity simultaneously along all the $3 \times M = 15$ parity lines shown in FIGS. 1 to 3.

Referring now to FIG. 5, there is set out an example of a $4 \times 5$ data bit or byte array, with an appended phantom row, and such that all aforementioned 15 lines have even parity i.e., the XOR-sums along all these lines is zero.

As shown in the following examples, the encoding process allocates $M - R = 2$ DASDs (columns) in the array for storing the original data, and computes $R = 3$ redundant remaining DASDs (columns). The rebuilding process recovers the contents of up to $R = 3$ unavailable DASDs. Both processes, the encoding and rebuilding, are carried out by the same algorithm and, thus, can be implemented by the same piece of hardware. More specifically, the encoding process is regarded as the rebuilding process applied to the last $R = 3$ DASDs, regarded as unavailable ones.

Steps of the Coding and Rebuild Method

The first step of the encoding-rebuilding method is calculating XOR-sums along the parity lines, M XOR-sums for the slope=0 lines, M sums for the slope=1 lines, and M sums for the slope=2 lines.

The second step is calculating an auxiliary row using basic bit-rotation, bit-shift, and XOR operations.

The third step calculates an associated base M-bit cell for each unavailable DASD. That is, up to three base M-bit cells altogether. The computation of each such M-bit cell requires only bit-rotation and XOR operations.

The fourth step extracts the contents of each unavailable DASD out of its associated base M-bit cell. To this end, up to $R - 1 = 2$ recursions are solved for each unavailable DASD. A preferred layout for this purpose is given in FIGS. 6, 7, and 8.

Layout of an M×M Data Array

Figure 6:
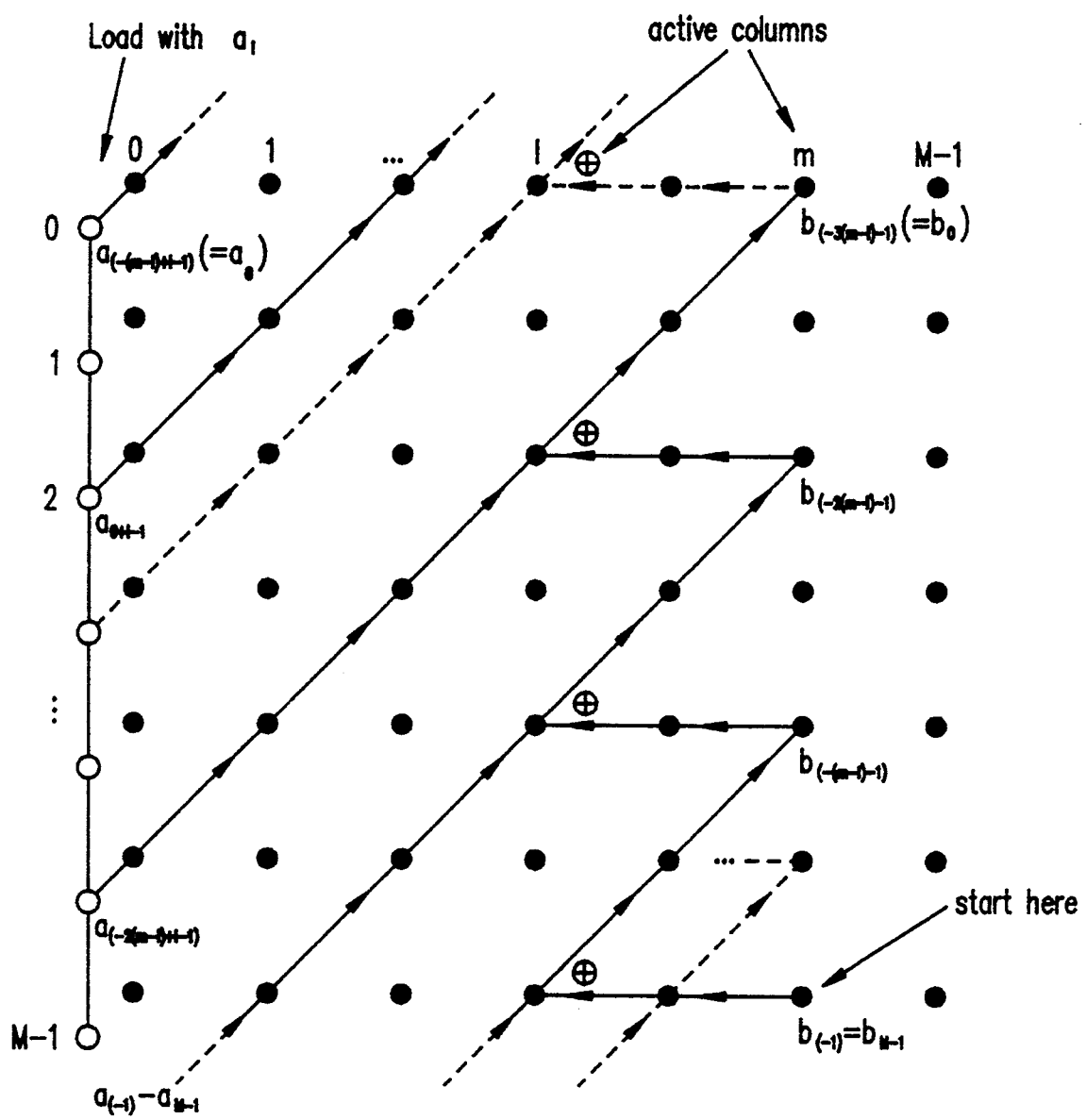
FIG. 6 shows a preferred layout for solving a recursion according to the invention yielding the contents of the unavailable DASD's.
Figure 7:
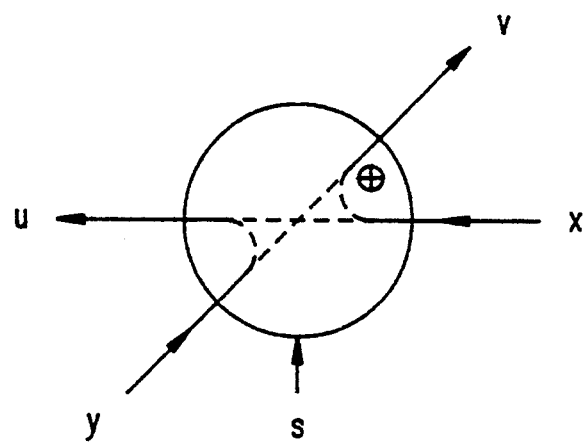
FIG. 7 depicts a selector unit utilized in the layout processing shown in FIG. 6.
Figure 8:
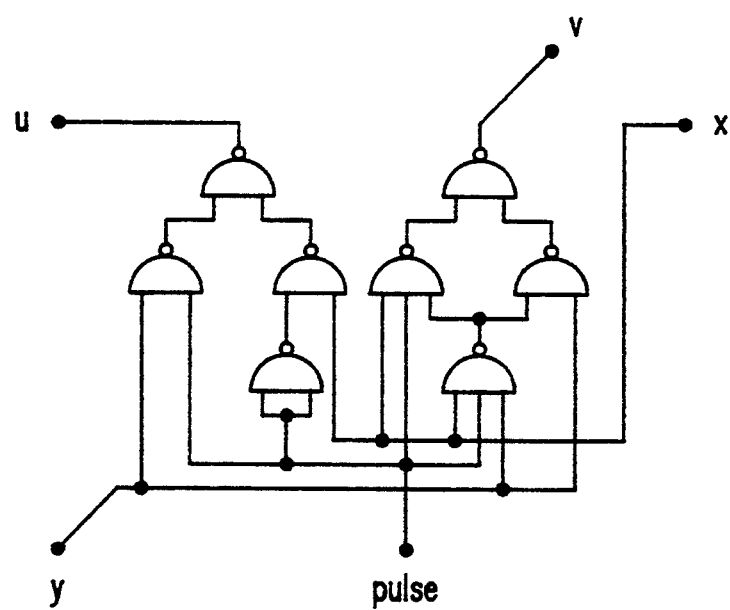
FIG. 8 illustrates a logical gate implementation of the selector unit shown in FIG. 7.
Figure 9:
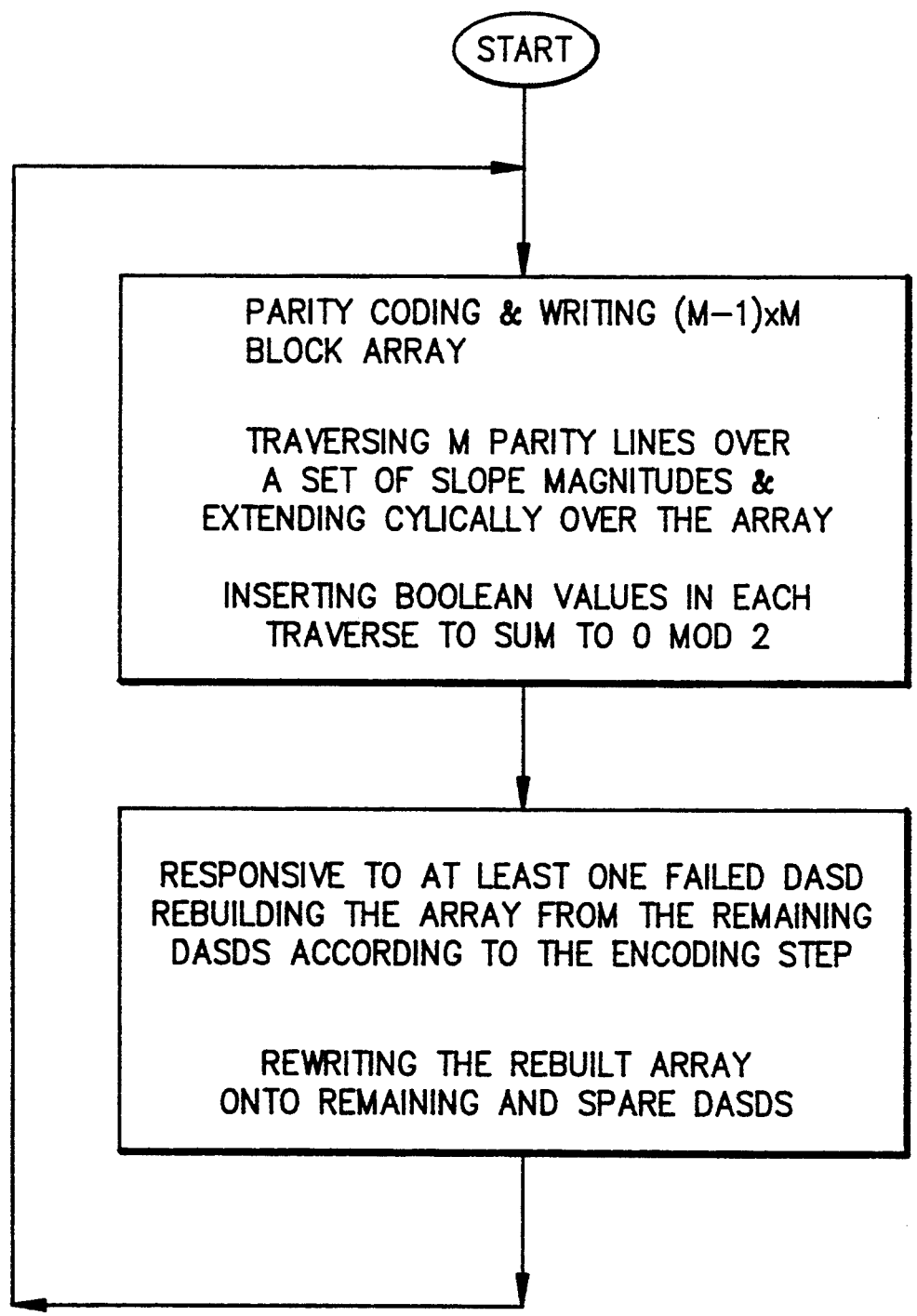
FIG. 9 shows the flow of control of the method of this invention.

Referring now to FIG. 6, there is shown a layout consisting of an M×M data bit or byte array. This layout may coincide with the space required to store the read/written DASDs, with each column in FIG. 6 corresponding to one DASD. Each element in the array is capable of storing one bit, and, addition, each such element is equipped with a selector unit which has two data inputs, x and y, two outputs, u and v, and an input control bit s (FIG. 7). When s=0, the selector is in 'transparent mode', in which case the input x is directed into u and the input y is directed into v. By setting s=1, the selector switches into 'active mode', where the input y is now directed into u and the XOR-sum x+y is directed into v. FIG. 8 shows an example of a hardware implementation of this selector unit.

The input data to each recursion computation is depicted in FIG. 6 at the leftmost column (the 'a' values), whereas the output values ('b') are eventually computed into column 'm'. In order to perform the recursion necessary for the above-mentioned fourth step, the selectors in certain columns, namely 'l' and 'm', are set to 'active mode', whereas those in the other columns are set to 'transparent mode'.

The specific choice of 'l' and 'm' depends both on the location of the current unavailable DASD being recovered, and on which one, out of the at most two recursions required for that particular unavailable DASD, is now being performed. The last output value (the 'b' value at the bottom) is initially set to zero, and information now flows and XORed up along the lines connecting the 'active' selectors in a zig-zag fashion, with the array, as before, extended cyclically.

In the event when the encoding-rebuilding algorithm is applied for encoding, only the last $R = 3$ columns in the array will eventually be active.

Data Recovery According to the Invention By Way of Example

In both the encoding and decoding/reconstruction examples to follow, the DASD array comprises five synchronous DASDs C0-C4. C0 and C1 are assigned to store data while C2, C3 and C4 are reserved for storing simple parity. It is assumed that the array is bit interleaved. This means that three bits and two parity bits (M=5) are read or written to C0-C4 at a time. Thus for M=5, the data array has the dimension $4 \times 5$.

Given an $(M-1) \times M$ data array where M=a prime number and the last row S4 is dummy to facilitate visualization of the wrap-around parity lines. We assume that columns C1, C2 and C3 are rendered unavailable, while we attempt to reconstruct them from columns C0 and C3. Since we are trying to retrieve 3 columns, we assume that the array has parity along the lines of slope 0 (rook), slope 1 (bishop) and slope 2 (rook), as shown in FIGS. 2, 3, and 4.

The polynomial notation below is slightly modified such that a polynomial in x expressed as $1 + X + X^2$ where $X^2$ means X raised to the second power, etc.

|    | C0 | C1 | C2 | C3 | C4 |
|----|----|----|----|----|----|
| S0 | 1  | x  | x  | 0  | x  |
| S1 | 1  | x  | x  | 1  | x  |
| S2 | 0  | x  | x  | 1  | x  |
| S3 | 1  | x  | x  | 1  | x  |
| S4 | 0  | 0  | 0  | 0  | 0  |

Written as a polynomial on the variable X, C0 can be represented as $$C0 = 1 + X + X^3 \text{ while } C3 \text{ is } C3 = X + X^2 + X^3$$

The array is assumed to be wrapped around in the manner of a torus. It is required to find C1(X), C2(X) and C4(X). The decoding involves solving for the unknown C1(X), C2(X), and C4(X) in the following polynomial equations:

$$(X + X^2)(X + X^4)C1(X) = \text{sigma1}(X)$$

$$(X^2 + X)(X^2 + X^4)C2(X) = \text{sigma2}(X)$$

$$(X^4 + X)(X^4 + X^2)C4(X) = \text{sigma4}(X)$$

where sigma1(X), sigma2(X), and sigma4(X) are certain polynomials of degree $\leq 3$, and the above equations hold modulo the polynomial $1 + X + X^2 + X^3 + X^4 = (X^5 + 1)/(X + 1)$.

There are 4 main steps in the decoding algorithm. The last step involves solving the recursions, while the first 3 steps find the right hand sides of the 3 equations, i.e., sigma1, sigma2 and sigma4.

Step 1

This step estimates the 3 syndromes. Each syndrome is a polynomial in X. The erased bits are assumed to be 0 for syndrome calculation. S0(X) is obtained by exclusiving-OR the 5 horizontal lines (rooks), S1(X) by exclusiving-OR the 5 lines of slope 1 (bishops) and S2(X) by exclusiving-OR the 5 lines of slope 2 (knights). The result of these calculations in the present array gives:

$$S0(X) = 1 + X^2$$

$$S1(X) = X^3 + X^4$$

$$S2(X) = 1 + X + X^2 + X^4$$

The 3 syndromes above are used to construct the so called syndrome polynomial in Z, denoted S(Z), whose coefficients are S0(X), S1(X) and S2(X). Hence, $$S(Z) = (1+X^2) + (X^3+X^4)Z + (1+X+X^2+X^4)Z^2.$$

Step 2

This step involves calculating the polynomial Q(Z) that is the product of the so called erasure locator polynomial with the syndrome polynomial calculated in step 1. The erasure locator polynomial is defined as $$R(Z) = (1+XZ)(1+(X^2)Z)(1+(X^4)Z).$$

Notice that the powers of X, i.e., 1, 2 and 4 correspond to the erased columns. We find Q(Z)=R(Z)S(Z) recursively.

The initial value for Q(Z) is set as S(Z). Q(Z) is then set as (1+XZ)Q(Z), thus $$Q(Z) = ((1+X^2)+(X^3+X^4)Z+(1+X+X^2+X^4)Z^2)+XZ((1+X^2)+(X^3+X^4)Z+(1+X+X^2+X^4)Z^2).$$

Multiplying by X is cyclic on the polynomials on X modulo X 5. So, $$X(1+X^2) = X+X^3, \quad X(X^3+X^4) = 1+X^4$$

and $$X(1+X+X^2+X^4) = 1+X+X^2+X^3.$$

This gives $$Q(Z) = ((1+X^2) + (X^3+X^4)Z + (1+X+X^2+X^4)Z^2) + ((X+X^3)Z + (1+X^4)Z^2 + (1+X+X^2+X^3)Z^3) =$$

$$(1+X^2) + (X+X^4)Z + (X+X^2)Z^2 +$$

$$(1+X+X^2+X^3)Z^3.$$

Similarly, in the next recursion we set Q(Z) as $(1+X^2)Q(Z)$. So, $$Q(Z) = ((1+X^2) + (X+X^4)Z + (X+X^2)Z^2) +$$

$$(1+X+X^2+X^3)Z^3)(1+X^2Z) ((1+X^2) +$$

$$(X+X^4)Z + (X+X^2)Z^2 + (1+X+X^2 +$$

$$X^3)Z^3) = (1+X^2) + (X+X^2)Z + (X^2 +$$

$$X^3)Z^2 + (1+X+X^2+X^4)Z^3 +$$

$$(1+X^2+X^3+X^4)Z^4.$$

Finally, in the last recursion sets Q(Z) as $(1+X^4)Q(Z)$, giving $$Q(Z) = ((1+X^2) + (X+X^2)Z + (X^2+X^3)Z^2 +$$

$$(1+X+X^2+X^4)Z^3 + (1+X^2+X^3+$$

$$X^4)Z^4) + (1+X^4Z)((1+X^2) + (X+X^2)Z +$$

$$(X^2+X^3)Z^2 + (1+X+X^2+X^4)Z^3 +$$

$$(1+X^2+X^3+X^4)Z^4) = (1+X^2) + (X^2 +$$

$$X^4)Z + (1+X+X^2+X^3)Z^2 + (1+X^4)Z^3 +$$

$$(X+X^2)Z^4 + (X+X^2+X^3+X^4)Z^5.$$

This is the end of step 2 of the algorithm.

Step 3

In this step the right hand sides of the recursion are found, i.e., the coefficients sigma1(X), sigma2(X) and sigma4(X).

In the previous step, it was found $$Q(Z) = (1+X^2) + (X^2+X^4)Z + (1+X+X^2+X^3)Z^2 + (1+X^4)Z^3 + (X+X^2)Z^4 + (X+X^2+X^3+X^4)Z^5 = Q0(X) + Q1(X)Z + Q2(X)Z^2 +$$

$$Q3(X)Z^3 + Q4(X)Z^4 + Q5(X)Z^5.$$

The value sigma1(X) is given by the coefficient 2 of dividing Q(Z) by 1+XZ. Similarly, sigma2(X) is given by the coefficient 2 of dividing Q(Z) by $1+X^2Z$ and sigma4(X) is given by the coefficient 2 of dividing Q(Z) by $1+X^4Z$. Next, each of these values is recursively determined.

Starting with sigma1(X). Initially, sigma1(X) is set as $Q0(X) = 1+X^2$. In the next recursion, sigma1(X) is set as $$sigma1(X) = Q1(X) + X$$

$$sigma1(X) = (X^2+X^4) + X(1+X^2) = X+X^2+X^3+X^4.$$

The final recursion for sigma1(X) sets $$sigma1(X) = Q2(X) + X$$

$$sigma1(x) = (1+X+X^2+X^3) + X(X+X^2+X^3+X^4) = 1+X^2+X^3.$$

A similar procedure is applied to sigma2(X). The initial value is set as $Q0(X) = 1+X^2$. Then, $$sigma2(X) = Q1(X) + (X^2)sigma2(X) = 0,$$

and finally, $$sigma2(X) = Q2(X) + (X^2)sigma2(X) = 1 + X + X^2 + X^3.$$

For sigma4(X), the initial value is also set as $Q0(X) = 1 + X^2$.
Then, $$sigma4(X) = Q1(X) + (X^4)sigma4(X) = X + X^2,$$

and finally, $$sigma4(X) = Q2(X) + (X^4)sigma4(X) = X^2 + X^3.$$

Step 4

This is the final step of the algorithm. It performs a double recursion for each of the missing values C1(X), C2(X) and C4(X). It is necessary to solve $$(X + X^2)(X + X^4)C1(X) = sigma1(X) = 1 + X^2 + X^3$$

$$(X^2 + X)(X^2 + X^4)C2(X) = sigma2(X) = 1 + X + X^2 + X^3$$

$$(X^4 + X)(X^4 + X^2)C4(X) = sigma4(X) = X^2 + X^3.$$

Starting with the first equation.
Let $(X + X^4)C1(X) = C1'(X)$, so we have to solve $$(X + X^2)C1'(X) = 1 + X^2 + X^3.$$

Let $C1'(X) = a0 + a1X + a2(X^2) + a3(X^3)$. It is necessary to find a0, a1, a2, a3 and a4. Notice that $$(X + X^2)C1'(X) = X(1+X)C1'(X) = 1 + X^2 + X^3,$$

so $$(1+X)C1'(X) = (X^{-1})(1 + X^2 + X^3) = X + X^2 + X^4.$$

Now, excluding terms in $X^4$, it should be remembered that the final result has to be given in polynomials of degree at most 3. From now on, $X^4$ is replaced by $1 + X + X^2 + X^3$, so the equation becomes $$(1+X)C1'(X) = 1 + X^3.$$

Notice that $$(1+X)C1'(X) = (1+X)(a0 + a1X + a2(X^2) + a3(X^3)) = (a0+a3) + (a1+a0+a3)X + (a2+a1+a3)(X^2) + a2(X^3) = 1 + X^3.$$

Solving the recursion, we start by
a2 = 1,
a2 + a1 + a3 = 0, so a1 + a3 = 1,
a1 + a0 + a3 = 0, so a0 = 1,
a0 + a3 = 1, so a3 = 0,
and since a1 + a3 = 1, we get a1 = 1. So, $$C1'(X) = 1 + X + X^2.$$

Next, the recursion $$(X + X^4)C1(X) = C1'(X) = 1 + X + X^2$$

should be solved.
This gives $$(1 + X^3)C1(X) = 1 + X + X^4 = X^2 + X^3.$$

If $C1(X) = a0 + a1X + a2(X^2) + a3(X^3)$, $$(1 + X^3)C1(X) = (a0 + a2 + a1) + a3X + (a2 + a1)(X^2) + (a3 + a0 + a1)(X^3) = X^2 + X^3.$$

Solving, we obtain a3 = 0, a0 + a1 = 1, a2 = 1, a1 = 0 and a0 = 1. So $$C1(X) = 1 + X^2.$$

Next, same process for C2(X) and C4(X) is repeated. For C2(X), we have to solve $$(X + X^2)(X^2 + X^4)C2(X) = 1 + X + X^2 + X^3.$$

Define $(X^2 + X^4)C2(X) = C2'(X)$, so we solve $$(X + X^2)C2'(X) = 1 + X + X^2 + X^3,$$

or $$(1+X)C2'(X) = 1 + X + X^2 + X^4 = X^3.$$

If $C2'(X) = a0 + a1X + a2(X^2) + a3(X^3)$, we have $$(a0+a3) + (a1+a0+a3)X + (a2+a1+a3)(X^2) + a2(X^3) = X^3.$$

This gives a2 = 1, a1 + a3 = 1, a0 = 1, a3 = 1 and a1 = 0, so $$C2'(X) = 1 + X^2 + X^3.$$

Now we solve $$(X^2 + X^4)C2(X) = C2'(X) = 1 + X^2 + X^3.$$

This gives $$(1 + X^2)C2(X) = 1 + X + X^3.$$

Making $C2(X) = a0 + a1X + a2(X^2) + a3(X^3)$, we have $$(1 + X^2)C2(X) = (a0 + a3 + a2) + (a1 + a2)X + a0(X^2) + (a3 + a1 + a2)(X^3) = 1 + X + X^3.$$

So, a0 = 0, a3 + a2 = 1, a1 = 0, a2 = 0, a2 = 1 and a3 = 0.
This gives, $C2(X) = X^2$.
Finally, it is necessary to solve $$(X + X^4)(X^2 + X^4)C4(X) = sigma4(X) = X^2 + X^3.$$

Define $(X^2 + X^4)C4(X) = C4'(X)$, so we solve $$(X + X^4)C4'(X) = X^2 + X^3,$$

or, $$(1 + X^3)C4'(X) = X + X^2.$$

Making $C4'(X) = a0 + a1X + a2(X^2) + a3(X^3)$, we have $(1+X^3)C4'(X)=(a0+a2+a1)+a3X+(a2+a1)(X^2)+(a3+a0+a1)(X^3)=X+X^2.$ This gives $a3=1$, $a0+a1=1$, $a2=1$, $a1=0$ and $a0=1$. So, $C4'(X)=1+X^2+X^3.$ The final recursion is $(X^2+X^4)C4(X)=C4'(X)=1+X^2+X^3,$ or $(1+X^2)C4(X)=1+X+X^3$ Making $C4(X)=a0+a1X+a2(X^2)+a3(X^3)$, we have $(1+X^2)C4(X)=(a0+a3+a2)+(a1+a2)X+a0(X^2)+(a3+a1+a2)(X^3)=1+X+X^3.$ So, $a0=0$, $a3+a2=1$, $a1=0$, $a2=1$ and $a3=0$. This gives, $C4(X)=X^2.$ The final decoded array is then

|    | C0 | C1 | C2 | C3 | C4 |
|----|----|----|----|----|----|
| S0 | 1  | 1  | 0  | 0  | 0  |
| S1 | 1  | 0  | 0  | 1  | 0  |
| S2 | 0  | 1  | 1  | 1  | 1  |
| S3 | 1  | 0  | 0  | 1  | 0  |
| S4 | 0  | 0  | 0  | 0  | 0  |

The encoding is analogous to the decoding, except that the last 3 columns are missing.

Parity Block Coding, Writing and Array Rebuilding Algorithmically Embodied

The method and means of this invention as expressed above should also be articulated at the logical processing level. The next several paragraphs are directed to a structured pseudo-code type of presentation.

For rebuilding the data contents of up to R unavailable DASDs in a synchronous array of $M \leq R$ DASDs, requires:

(a) Computing parities of an $(M-1) \times M$ data bit array by XORing the bits along traverses of slopes $0, 1, 2, \ldots, R-1$, extended cyclically over the data array, and assuming a "phantom" all-zero row as an M-th row of the array, resulting in R values, one for each slope, each value being an M-bit cell.

(b) Substituting the result of (a) in an auxiliary row consisting of M-bit cells, and performing up to R iterations of:

(i) rotating the bits in each M-bit cell in the row, each M-bit cell rotated individually, as if the bits in each cell were on a circumference of a wheel. The amount of rotation (=cyclic shift) is equal to the location of one of the unavailable DASDs in the array, specific to each iteration.

(ii) Shifting the above-calculated contents of the M-bit cells, each as one block, and each to the location of the next in line, with the first (now vacant) one being zeroed.

(iii) XORing bitwise the above-calculated contents of the auxiliary row with its contents prior to the current iteration.

(iv) Setting the above-calculated result as the new contents of the auxiliary row for the next iteration step, if any.

(c) For each unavailable DASD, assigning a base M-bit cell, initially preset to the first M-bit cell of the computed auxiliary row of (b), and performing on that base M-bit cell up to R iterations of:

(i) rotating the bits in the base M-bit cell as if the bits in each cell were on a circumference of a wheel. The amount of rotation (=cyclic shift) is equal to the location of the unavailable DASD with which the base M-bit cell is associated with.

(ii) XORing bitwise the above-calculated M-bit cell with an M-bit cell of the auxiliary row in (b), indexed by the number of iteration steps (current inclusive) performed here thus far.

(iii) Setting the above-calculated M-bit cell as the new value of the base M-bit cell for the next iteration step, if any.

(iv) In the last iteration, and in case the last base M-bit cell is 1, inverting all the bits in the M-bit cell and setting the result as the base M-bit cell.

(d) Defining for each unavailable DASD the following recursive procedure for updating a current M-bit cell associated with the unavailable DASD into a newly-computed base M-bit cell by:

(i) XORing the parity of the current M-bit cell into each bit of the current M-bit cell.

(ii) Starting with a last zero bit of the newly-computed base M-bit cell, and designating that bit as a currently-computed bit.

(iii) Designating a next-to-compute bit in the newly-computed base M-bit cell at distance from the currently-computed bit equal to the distance from the currently-rebuilt DASD to the location of a reference unavailable DASD, indexed by the the number of times this step, (iii), is encountered, while skipping the currently-rebuilt DASD in the index assignment, and while extending the M-bit cell bit locations cyclically as if they were on a circumference of a wheel (that is, locations in M-bit cells are all computed modulo M).

(iv) Designating a reference bit in the current base M-bit cell, whose location is obtained by adding the location of next-to-compute bit and the location of the reference unavailable DASD defined in (iii).

(v) The next-to-compute bit obtained by XORing the reference bit and the currently-computed bit.

(vi) Setting the next-to-compute bit as the currently-computed bit.

(vii) Returning to (iii), unless the currently-computed bit is the last bit in the newly-computed base M-bit cell.

(viii) Setting the newly-computed base M-bit cell as the current M-base cell.

(e) Extracting the contents of each unavailable DASD out of its corresponding base M-bit cell by up to $R-1$ iterations of the recursive procedure (d) starting with base M-bit cell of (c), and ending with a current M-base cell equal to the contents of the unavailable DASD.

Associating the above procedure with the last example, (a) computes the three syndromes $S0(X)$, $S1(X)$ and S2(X) of Step 1 in the example. The auxiliary row in (b) is the polynomial Q(Z) of step 2, with is coefficients Q0(X), Q1(X), Q2(X), ..., standing for the M-bit cells. The base M-bit cells of (c) are the polynomials sigma1(X), sigma2(X), and sigma4(X) computed in Step 3. Finally, Step 4 of the example corresponds to (d) and (e).

For correcting one DASD in error in the presence of up to R−2 unavailable DASDs, requires:

(a) Computing parities of an (M−1)×M data bit array as in step (a) above.

(b) Computing an auxiliary row of M-bit cell as in step (b) above.

(c) Finding the rotational (cyclical) displacement between a pair of consecutive M-bits cells in the auxiliary row of (b), indexed by the number of unavailable DASDs, with the rotational displacement found, up to bitwise M-bit inversion, using the linear-time algorithm in Y. Shiloach, "A fast equivalence-checking algorithm for circuit list," Inform. Proc. Lett., 9 (1979), pp. 236-238.

(d) Regarding the DASD indexed by the displacement found in (c) as an unavailable DASD, and updating the auxiliary row of (b) accordingly.

(e) For each unavailable DASD, assigning a base M-bit cell, as in step (c) above.

(f) Defining for each unavailable DASD a recursive procedure for updating a current M-bit cell associated with the unavailable DASD into a newly-computed base M-bit cell as in step (d) above.

(g) Extracting the contents of each unavailable DASD out of its corresponding base M-bit cell by up to R−2 iterations of the recursive procedure (f) starting with base M-bit cell of (e), and ending with a current M-base cell equal to the contents of the unavailable DASD.

Extensions

The block parity coding, writing, and array rebuilding principles of this invention may be extended to data storage on magnetic or optical multi-track tapes consisting of many tracks where information is stored in parallel. Each bit or byte in a track is synchronous with every bit or byte in the same location in different tracks. Sometimes, loss of signal in one or more tracks makes the whole track unavailable to the user, so coding is employed in order to retrieve the information lost in the erased tracks. The logical processing of magnetic of optical multi-track tape storage proceeds on the same error detection and correction modality as that used with DASD arrays.

We claim:

1. An external storage subsystem having a plurality of DASDs and a control unit for attaching a subset of said plurality of DASDs to a processor in the form of an array of M DASDs, said array of M DASDs including P DASDs for storing parity blocks and M−P DASDs for storing data blocks, logically related ones of said data and parity blocks forming addressable parity groups, no two blocks from the same parity group being stored on the same DASD in said array, said processor sending sequences of read and write commands to said control unit for selectively accessing at least one data block and one parity block from the same parity group, M being at least equal to two and P being at least equal to one, a subset of S DASDs of said plurality of DASDs being available as spares for inclusion in said DASD array, S being at least equal to P, a method for encoding and rebuilding the data contents of up to R failed data and parity DASDs, R being less than or equal to P, comprising the steps of:

(a) parity coding and writing a (M−1)×M array of data and parity blocks onto the M DASDs, each block being uniform in extent and at least one bit in length, said data and parity blocks being coded and written onto the M DASDs by said control unit by (1) traversing M parity lines projected onto said (M−1)×M data and parity block array for each one of a set of slopes consisting of slope magnitudes 0, 1, 2, ..., P−1, and extending cyclically over said (M−1)×M data and parity block array; and (2) inserting Boolean values into the (M−1)×M data and parity block array in counterpart DASD array locations during each traverse such that data and parity blocks in said data and parity block array encountered over each traverse sum to zero modulo 2 (even parity), M being a prime number, said data and parity block array being fully encoded in M*(P−18) parity line traverses; and (b) responsive to any unavailability of R DASDs distributed among the M−P data and P parity DASDs, (1) rebuilding the data and parity block array by said controller by coding the data and parity blocks from M−R available DASD's according to step (a) in which those data and parity blocks as stored on the R unavailable DASDs are assumed to exhibit a uniform default value, and, (2) rewriting the rebuilt data and parity block array onto a DASD array formed from M−R available DASDs and R of the S spare DASDs.

2. The method according to claim 1, wherein said array of M DASDs being synchronous, and further wherein repeating steps (a) and (b) results in correction of one DASD in error and up to R−2 unavailable DASDs.

3. The method according to claim 1, wherein said traverses of said parity lines of slopes 0, 1, 2, ..., P−1 emulating a set of positively sloped motions of a chess rook, bishop, and knight upon a logical chessboard projection of the (M−1)×M data and parity block array.

4. The method according to claim 1, wherein if M is other than prime number, causing steps (a) and (b) to operatively behave as if the data and parity block array were expanded to include additional columns of uniform binary value to yield an effective array (M′−1)*M′ where M′ thereby constitutes a prime number and where M′ is greater than M.

5. The method according to claim 1, wherein said method further includes the steps at the control unit of:

(c) enqueuing and executing the rewriting of the rebuilt data and parity blocks on R of the S spare DASDs on a regularly or randomly scheduled basis.

6. An external storage subsystem having a plurality of DASDs and a control unit for attaching a subset of said plurality of DASDs to a processor in the form of an array of M DASDs, said array of M DASDs including P DASDs for storing parity blocks and M−P DASDs for storing data blocks, logically related ones of said data and parity blocks forming addressable parity groups, no two blocks from the same parity group being stored on the same DASD in said array, said processor sending sequences of read and write commands to said control unit for selectively accessing at least one data block and one parity block from the same parity group, M being at least equal to two and P being at least equal to one, a capacity equivalent to subset of S DASDs of said plurality of DASDs being distributed among the M DASDs as spare space, S being at least equal to P, a method comprising the steps of:

(a) parity coding and writing a $(M-1) \times M$ array of data and parity blocks onto the M DASDs, each block being uniform in extent and at least one bit in length, said array data and parity blocks being coded and written onto the M DASDs by said control unit by (1) traversing M parity lines projected onto said data and parity block array for each one of a set of slopes consisting of slope magnitudes $0, 1, 2, \ldots, P-1$, and extending cyclically over said data and parity block array; and (2) inserting Boolean values into the $(M-1) \times M$ data and parity block array in counterpart DASD array locations during each traverse such that data and parity blocks in said data and parity block array encountered over each traverse sum to zero modulo 2 (even parity), M being a prime number, said data and parity block array being fully encoded in $M*(P-1)$ parity line traverses; and (b) responsive to any unavailability of R DASDs distributed among the M−P data and P parity DASDs, (1) rebuilding the data and parity block array by said control unit by coding the data and parity blocks from M−R available DASD's according to step (a) in which those data and parity blocks as stored on the R unavailable DASDs are assumed to exhibit a uniform default value, and (2) rewriting the rebuilt data and parity block array onto a DASD array formed from M−R available DASDs and R of the S spare DASDs.

7. The method according any one of the claims 1 or 6, wherein the coding and writing steps further includes the steps of generating said data and parity block array and recording said data and parity block array on one of the DASD arrays selected from the set consisting of a two dimensional distribution of $(M-1) \times M$ DASDs, and a DASD array having a first dimension formed from M DASDs and a second dimension formed from $(M-1)$ predetermined recording extents on at least one track for each of M DASDs.

8. An external storage subsystem having a plurality of DASDs and a control unit for attaching a subset of said plurality to a processor in the form of an array of M DASDs, said array of M DASDs including P DASDs for storing parity blocks and M−P DASDs for storing data blocks, logically related ones of said data and parity blocks forming addressable parity groups, no two blocks from the same parity group being stored on the same DASD, said processor sending sequences of read and write commands to said control unit for selectively accessing at least one data block and one parity block from the same parity group, M being at least equal to two and P being at least equal to one, a subset of S DASDs of said plurality being available as spares for inclusion in said array, S being at least equal to P, wherein said control unit comprises:

(a) means for parity coding and writing a $(M-1) \times M$ array of data and parity blocks onto the M DASDs, each block being uniform in extent and at least one bit in length, said array data and parity blocks being coded and written onto the M DASDs, said parity coding and writing means include (1) means for traversing M parity lines projected onto said data and parity block array for each one of a set of slopes consisting of slope magnitudes $0, 1, 2, \ldots, P-1$, and extending cyclically over said data and parity block array; and (2) means for inserting Boolean values into the $(M-1) \times M$ data and parity group array in counterpart DASD array locations during each traverse such that data and parity blocks in said data and parity block array encountered over each traverse sum to zero modulo 2 (even parity), M being a prime number, said data and parity block array being fully encoded in $M*(P-1)$ parity line traverses; and (b) means responsive to any unavailability of R DASDs distributed among the M−P data and P parity DASDs for (1) rebuilding the data and parity block array by said control unit by coding the data and parity blocks from M−R available DASD's according to the parity coding and writing means in which those data and parity blocks as stored on the R unavailable DASDs are assumed to exhibit a uniform default value, and, (2) rewriting the rebuilt data and parity block array onto a DASD array formed from M−R available DASDs and R of the S spare DASDs.

9. The method according to claim 8, wherein said control unit includes means for accessing said array of M DASDs synchronously.

* * * * *

UNITED STATES PATENT AND TRADEMARK OFFICE
CERTIFICATE OF CORRECTION

PATENT NO. : 5,351,246
DATED : Sept. 27, 1994
INVENTOR(S) : Blaum et al.

It is certified that error appears in the above-indentified patent and that said Letters Patent is hereby corrected as shown below:

Column 3, line 15, delete "May 5, 1980" and add --May 6, 1980--

Column 8, line 6, delete "at most two" and add --two most--

Column 9, line 46, before "5" add --^--.

Column 13, line 47, delete "$M \underset{=}{<} R$" and add --$M \underset{=}{>} R$--.

Signed and Sealed this

Twenty-fifth Day of July, 1995

Attest:

BRUCE LEHMAN

Attesting Officer       Commissioner of Patents and Trademarks